US008549365B2

(12) United States Patent
Carlach

(10) Patent No.: US 8,549,365 B2
(45) Date of Patent: Oct. 1, 2013

(54) METHOD AND DEVICE FOR FLEXIBLE ERROR CORRECTION ENCODING AND CORRESPONDING COMPUTER PROGRAM

(75) Inventor: Jean-Claude Carlach, Rennes (FR)

(73) Assignee: France Telecom, Paris (FR)

( * ) Notice: Subject to any disclaimer, the term of this patent is extended or adjusted under 35 U.S.C. 154(b) by 242 days.

(21) Appl. No.: 13/147,355

(22) PCT Filed: Feb. 1, 2010

(86) PCT No.: PCT/FR2010/050158
§ 371 (c)(1),
(2), (4) Date: Aug. 1, 2011

(87) PCT Pub. No.: WO2010/086572
PCT Pub. Date: Aug. 5, 2010

(65) Prior Publication Data
US 2011/0289367 A1    Nov. 24, 2011

(30) Foreign Application Priority Data
Jan. 30, 2009  (FR) ..................... 09 50628

(51) Int. Cl.
*G06F 11/00* (2006.01)
*H03M 13/00* (2006.01)

(52) U.S. Cl.
USPC .......................................... 714/701; 714/777

(58) Field of Classification Search
USPC ........................... 714/701, 746, 758, 777, 801
See application file for complete search history.

(56) References Cited

U.S. PATENT DOCUMENTS
6,745,362 B1   6/2004  Carlach et al.
8,059,709 B2 * 11/2011  Abou Rjeily ................. 375/239
2002/0124224 A1 * 9/2002  Blankenship et al. ........ 714/758

FOREIGN PATENT DOCUMENTS
EP   1101288 A1   5/2001
FR   2782425 A1   2/2000

OTHER PUBLICATIONS

Carlach J. et al., "A Systematic Construction of Self-Dual Codes"—IEEE Transactions on Information Theory, Nov. 1, 2003.
Chiaraluce F. et al., "Extended Hamming Product Codes Analytical Performance Evaluation for Low Error Rate Applications." IEEE Transactions on Wireless Communications, Nov. 1, 2011.
Chiaraluce F. et al., "Some New Results on Extended Hamming Products Codes and Punctured Product Codes" Vehicular Technology Conference, Mar. 17/19, 2004.
French Search Report dated Jan. 11, 2010 for corresponding French Application No. FR0950628, filed Jan. 30, 2009.
International Search Report dated May 6, 2010 for corresponding International Application No. PCT/FR2010/050158, filed Feb. 1, 2010.
English Translation of the International Preliminary Report on Patentability and Written Opinion dated Aug. 9, 2011 for corresponding International Application No. PCT/FR2010/050158, filed Feb. 1, 2010.

* cited by examiner

*Primary Examiner* — Shelly A Chase
(74) *Attorney, Agent, or Firm* — David D. Brush; Westman, Champlin & Kelly, P.A.

(57) ABSTRACT

An error correction encoding device is provided that combines redundancy data with source data, said device including: at least three encoding stages and at least two permutation stages. Each encoding stage implements at least one set of three basic encoding modules, in which a first encoding stage receives said source data and a last encoding stage provides said redundancy data. Each encoding module implements a basic code and includes c inputs and c outputs, c being an integer. The permutation stages are inserted between two consecutive encoding stages and each permutation stage implements a c-cyclic permutation.

11 Claims, 9 Drawing Sheets

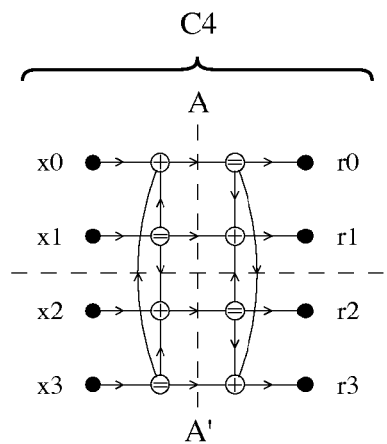
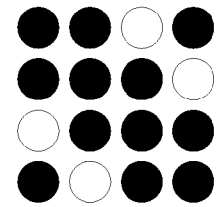
Fig. 1a Fig. 1b
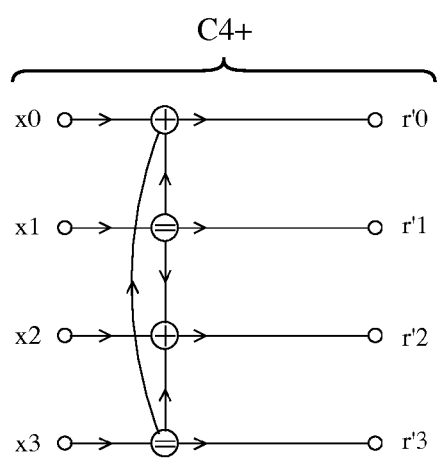
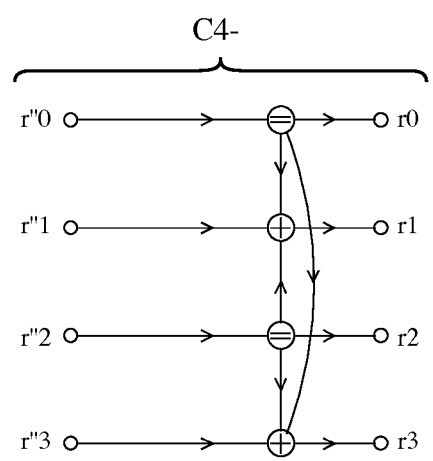
Fig. 2a Fig. 2b

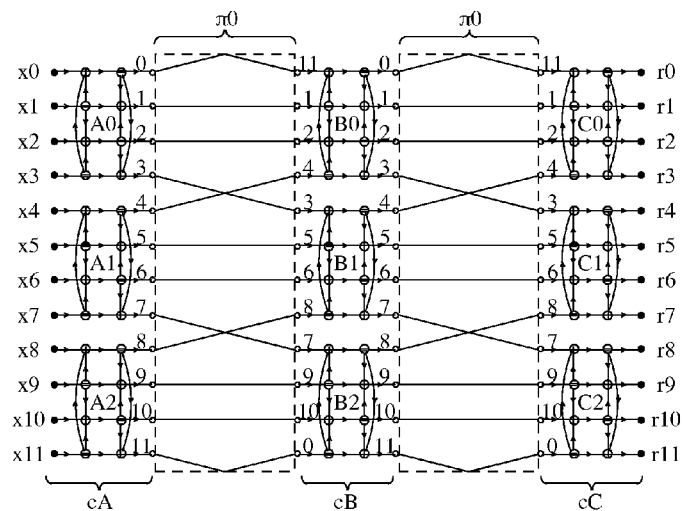 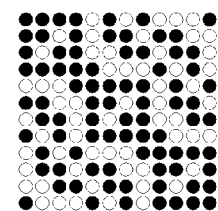
Fig. 3a    Fig. 3b
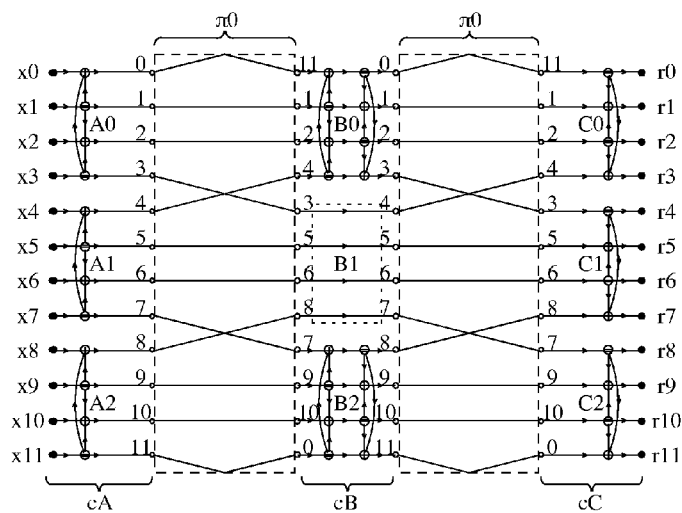 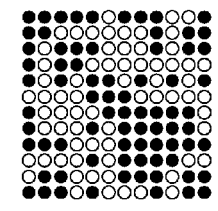
Fig. 4a    Fig. 4b

METHOD AND DEVICE FOR FLEXIBLE ERROR CORRECTION ENCODING AND CORRESPONDING COMPUTER PROGRAM

CROSS-REFERENCE TO RELATED APPLICATIONS

This Application is a Section 371 National Stage Application of International Application No. PCT/FR2010/050158, filed Feb. 1, 2010 and published as WO 2010/086572 on Aug. 5, 2010, not in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The field of the disclosure is that of the encoding of digital data. More specifically, the disclosure pertains to error correction codes.

The disclosure can be applied especially but not exclusively to the encoding of source data organized in data blocks that are independent of one another and therefore have to be encoded and decoded block by block, as well as to the encoding of data streams (convolutive encoding).

BACKGROUND OF THE DISCLOSURE

There are many known encoding techniques enabling the correction of transmission errors.

These error correction codes enable the correction of transmission errors inherent in every communications channel. Thus, they are widely used in the following fields:
- the transmission of information by electrical wire telecommunication, as in ADSL standards, or optical communications, on optical fibers or in open space;
- the transmission of information in wireless space and terrestrial radio communications, as in TNT digital television systems, DAB digital radio, GSM or UMTS telephony, WiFi radio networks and also in future communications systems such as future standards for DVB, 4G, LTE, "future Internet" or transmission between communicating vehicles, objects or machines etc;
- the compression and decompression of information sources;
- the generation and detection of sequences, known as scrambling, in CDMA systems;
- the storage of information in magnetic, optical, mechanical or electrical mass memories to constitute hard disk drives or random access memories for computers, or USB interface memory sticks etc;
- the correction of information during computation in an integrated circuit of a microprocessor or in a computer; etc.

These transmission errors are caused for example by the thermal noise of the electronic components of the receiver, electromagnetic scrambling (whether intentional or otherwise), echoes or multiple propagation in the case of wireless propagation or in an electrical energy network etc.

To enable the correction of these transmission errors, error correction codes enable the generation of redundancy data from source data.

Thus, an error correction code is classically defined by:
- a length n, corresponding to the data output from the encoder (code word with a length n formed by k source data pieces and (n−k) redundancy data pieces),
- a number of bits or symbols k of payload information, corresponding to the data at input of the encoder (also called source data), and
- a minimum distance $d_{min}$.

The minimum distance of a code $d_{min}$ corresponds to the minimum distance between two code words. It makes it possible to determine the maximum number of errors that the code can correct in a code word.

The rate of the code is defined by $R=k/n$.

For example, a (8, 4, 4) Hamming code is a code with a length $n=8$, taking at input $k=4$ payload information symbols with a minimum distance $d_{min}=4$, and a rate of ½.

The very first studies on error correction codes data from the 1940's.

More recently, in the European patent EP 1 101 288, J. C. Carlach and C. Vervoux presented a new encoding scheme known as the "Cortex code". These codes are well known to those skilled in the art and are based on the building of a code with efficient connection properties from simple small basic codes placed in parallel in a certain number of stages separated by permutations.

In general, one drawback of error correction codes having a length n and containing k payload information symbols lies in the fact that the minimum distance $d_{min}$ is not optimal for these lengths n and k, i.e. the minimum distance is not the closest possible distance from an upper boundary for which the code enables the detection of the maximum number of errors.

Now the fact of having a minimum distance $d_{min}$ that is the greatest possible minimum distance enables the detection of $(d_{min}-1)$ erroneous symbols and the correction of $\lfloor (d_{min}-1)/2 \rfloor$ of these erroneous symbols (where the operator $\lfloor . \rfloor$ designates the integer part).

Furthermore, for industrial-scale use, the optimizing of the error correction codes also includes the minimizing of encoding and decoding complexities in terms of costs of hardware and energy consumed.

Paradoxically, these problems of optimizing error correction codes are more difficult to deal with when the lengths n of the codes range from small to average, i.e. of the order of $n<1000$.

This is so because that the classic algorithm, called a belief propagation algorithm, or its variants, becomes increasingly sub-optimal as the length of the cycles diminishes.

A cycle is a closed path in a Tanner graph representing the constraints (+ and =) which must be fulfilled by the symbols of a word for this word to be a word of a code.

There is therefore a need for new error correction codes giving efficient results (i.e. a great minimum distance) such as the Cortex codes, and having short cycles.

SUMMARY

An aspect of the disclosure relates to an error correction encoding device of the type associating redundancy data with source data, said device comprising:
- at least three encoding stages, each implementing at least one set of three basic encoding modules, including a first encoding stage, a last encoding stage and at least one intermediate encoding stage, each encoding module implementing a basic code,
each encoding stage receiving data to be processed, distributed among the different basic encoding modules and delivering processed data coming from said basic encoding modules,
said first encoding stage receiving said source data and said last encoding stage delivering said redundancy data;
at least two permutation stages, said permutation stages being inserted between two successive encoding stages, called a previous encoding stage and a following encoding stage, and distributing the processed data coming from each basic encoding module of the previous encoding stage between at least two basic encoding modules of the following encoding stage.

According to an embodiment of the invention, each basic encoding module comprises c inputs and c outputs, with c being an integer, and each permutation stage implements a c-cyclic type permutation.

Thus, an embodiment of the invention relies on a novel and inventive approach to error correction encoding that makes it possible, for a given rate, to obtain a code that performs well with the greatest possible minimum distance and the simplest possible implementation, and that enables decoding of reduced complexity.

Indeed, the basic encoding modules are chosen in such a way that, when combined with c-cyclic type permutations, the resulting code is optimal and self-dual.

To this end, the encoding stages are at least three in number and are separated by permutations, chosen so as to leave a maximum of invariant positions and comprise a minimum number of cycles.

The use of c-cyclic permutations makes it possible especially to minimize the number of memory access (read/write) operations and to prevent problems of memory access conflict. Indeed, the memory can be partitioned into c blocks in each of which it is possible to store a piece of data in a memory page or in a sub-block b with a "modulo c" address. For example, for a 4-cyclic permutation, it is possible to store the information $a_0$, $a_4$, $a_8$ in a first block, the data $a_1$, $a_5$, $a_9$ in a second block, the data $a_2$, $a_6$, $a_{10}$ in a third block, and the data $a_3$, $a_7$, $a_{11}$ in a fourth block.

In particular, said basic codes belong to the group comprising:
a Hamming code with a transfer matrix P;
a Hamming half-code with transfer matrix $P^+$ or $P^-$, resulting from a division into two of a Hamming code with transfer matrix P such that
$P = P^+ \times P^- = P^- \times P^+$;
a left half-code such that:
for the even indices (2i) with $0 \leq 2i \leq (c-1)$:

$$r_{2i} = \sum_{j=-m}^{j=+m} x_{2i+j}, \text{ where } m = \left\lfloor \frac{\text{degree}}{2} \right\rfloor$$

the operator $\Sigma$ is the sum modulo 2, operator also called "exclusive OR", and where the degree corresponds to the number of inputs of the "exclusive OR" operations;
for the odd indices (2i+1) with $1 \leq 2i+1 \leq (c-1)$:

$r_{2i+1} = x_{2i+1}$, with $r_i$ being redundancy data pieces and $x_i$ being source data pieces;
a right half-code that is dual to said left half-code such that:
for the even indices (2i) with $0 \leq 2i \leq (c-1)$:

$r_{2i} = x_{2i}$, for the odd indices (2i+1) with $1 \leq 2i+1 \leq (c-1)$:

$$r_{2i+1} = \sum_{j=-m}^{j=+m} x_{2i+1+j}, \text{ where } m = \left\lfloor \frac{\text{degree}}{2} \right\rfloor$$

the operator $\Sigma$ is the sum modulo 2 operator also called "exclusive OR" where the degree corresponds to the number of inputs of the "exclusive OR" operation;
with $r_i$ being redundancy data pieces and $x_i$ being source data pieces;
an identity code.

Thus, the basic codes have the property of implementing self-dual codes such as the Hamming code and the identity code, or codes forming a self-dual code when they are concatenated, such as the Hamming left half-codes (with transfer matrix $P^+$) and Hamming right half-codes (with transfer matrix $P^-$). This property of self-duality enables optimum decoding with reduced decoding complexity. Furthermore it ensures especially an encoding rate equal to ½.

According to one particular characteristic of an embodiment of the invention, the encoding device includes at least one posterior scrambling stage inserted between two successive encoding stages, one posterior scrambling stage comprising two successive scrambling half-stages, called first and second posterior scrambling sub-stages, implementing different types of scrambling, said first posterior scrambling sub-stage comprises at least two distinct scrambling modules, each scrambling module receiving processed data coming from at least one set of three encoding modules of same intermediate encoding stage and delivering scrambled data, taken at input of said second posterior scrambling sub-stage, each scrambling module implementing different types of scrambling, and said device comprises at least one prior scrambling stage, inserted between two successive encoding stages, a prior scrambling stage comprising at least one prior scrambling sub-stage implementing a scrambling identical to a second posterior scrambling sub-stage of one of said posterior scrambling stages.

Thus, the error correction encoding device of an embodiment of the invention makes it possible, by adding scrambling stages before and after imbricated stages of permutation and encoding, to obtain codes of greater length which preserve the property of the greatest possible minimum distance dmin.

The term "scrambling" is understood here to mean any type of distribution, permutation, rotation etc.

According to one particular aspect of an embodiment of the invention, said prior scrambling stage includes at least two successive scrambling sub-stages called first and second prior scrambling sub-stages, implementing different types of scrambling and said second prior scrambling sub-stage includes at least two distinct scrambling modules, each scrambling module receiving scrambled data from said first prior scrambling sub-stage and providing re-scrambled data to at least one set of three encoding modules of a same intermediate encoding stage, each scrambling module implementing different types of scrambling.

Thus, the choice of the different scrambling modules gives an optimum code of reduced complexity, both when encoding and when decoding.

The use of superimposed scrambling sub-modules of different types gives a great diversity of basic codes. Indeed, the permutations at input and/or at output of the basic codes give codes with different combinations of symbols. The increase in the diversity of the basic codes increases the minimum distance between two words of the resulting total code.

In particular, said scrambling modules or scrambling substages implement a scrambling belonging to the group comprising:

an identity scrambling such that:
$\forall i=0, 1, \ldots, (k-1)\ \pi_k(i)=i$;
a scrambling such that:

$$\forall\ i = 0, 1, \ldots, (k-1) \begin{cases} \pi_{\Delta,k}(i) = \Delta_0 + i(\mathrm{mod}\,k) & \text{if } i \equiv 0(\mathrm{mod}\,c) \\ \pi_{\Delta,k}(i) = \Delta_1 + i(\mathrm{mod}\,k) & \text{if } i \equiv 1(\mathrm{mod}\,c) \\ \vdots & \vdots \\ \pi_{\Delta,k}(i) = \Delta_{c-1} + i(\mathrm{mod}\,k) & \text{if } i \equiv (c-1)(\mathrm{mod}\,c); \end{cases}$$

with conditions where $\Delta=\{\Delta_0, \Delta_1, \ldots, \Delta_{c-1}\}$ is a set of integer parameters such that:

the parameters ($\Delta_0$, $\Delta_1$, L, $\Delta_{c-1}$) must take at least three different values, or if the parameters ($\Delta_0$, $\Delta_1$, L, $\Delta_{c-1}$) take only two different values then each of the two values is at least present twice in the set $\Delta$, a scrambling such that:

$$\pi_{Bk}(i) = \left\lfloor \frac{i}{p} \right\rfloor + c*(i\,\mathrm{mod}\,p) \forall\ i = 0, 1, \ldots, (k-1), \text{ with } p = \left\lfloor \frac{k}{c} \right\rfloor,$$

with k being the permutation length.

According to one particular characteristic of an embodiment of the invention, said basic encoding modules implement an identical basic code.

Thus, the error correction encoding device according to an embodiment of the invention is simplified by the use of basic encoding modules implementing identical basic codes. Indeed, the technical implementation of the encoding modules is simplified by the possibility of successively re-using encoding modules implementing identical codes.

In particular, said identical basic code is a Hamming code with a length n equal to eight, comprising k equal to four symbols of payload information and a minimum distance $d_{min}$ equal to four.

According to one particular aspect of an embodiment of the invention, c is an even integer.

According to one particular characteristic of an embodiment of the invention, said permutation stages distribute two pieces of processed data coming from a basic encoding module of a preceding encoding stage among two basic encoding modules of a following encoding stage.

According to one particular aspect of an embodiment of the invention, said device comprises a zero-forcing module placing at least one of said source data items and/or at least one of said redundancy data items at the value zero.

This zero-forcing of certain data items at input and/or output of the basic encoding modules makes it possible especially to obtain, very flexibly, codes of rates different from ½ and with minimum distances that remain good, even when the rate tends towards 1. Similarly, quasi-optimal codes can be built with rates tending towards zero. Indeed, the pieces of data zero-forced when encoding represent, at reception, perfect, noise-free zero-value pieces of information.

An embodiment of the invention also pertains to an error correction encoding method of the type associating redundancy data (r0 to r11) with source data (x0 to x11), implementing:

at least three encoding steps, including a first encoding step, a last encoding step and at least one intermediate encoding step, each implementing at least one set of three basic encoding modules, each encoding module implementing a basic code, each encoding step receiving data to be processed, distributed among the different basic encoding modules and delivering processed data coming from said basic encoding modules, said first encoding step receiving said source data and said last encoding step delivering said redundancy data; and at least two permutation steps, said permutation steps being implemented between two successive encoding steps, called a preceding encoding step and a following encoding step, and distributing the processed data coming from each basic encoding module implemented in the previous encoding step between at least two basic encoding modules implemented in the following encoding step.

According to an embodiment of the invention, each basic encoding module includes c inputs and c outputs, with c being an integer and each permutation step implements a c-cyclic type permutation.

Such a method can be implemented by an error correction encoding device as described here above. This method can be varied to take the form of different embodiments respectively comprising the different characteristics pertaining to the different embodiments of the error correction encoding device according to an embodiment of the invention.

Finally, an embodiment of the invention also pertains to a computer program recorded on a non-transitory computer-readable medium and comprising instructions to implement the error correction encoding method as described here above when said program is executed by a processor.

BRIEF DESCRIPTION OF THE DRAWINGS

Other features and advantages shall appear more clearly from the following description of a particular embodiment, given by way of a simple illustrative and non-exhaustive example, and from the appended figures, of which:

FIG. 1a illustrates an example of a basic encoding module according to one embodiment of the error correction encoding device of the invention, representing a compact Hamming encoder C4;

FIG. 1b illustrates the transfer matrix P of the encoder of FIG. 1a;

FIGS. 2a and 2b illustrate two examples of a basic encoding module according to one embodiment of the error correction encoding device of the invention, representing respectively a Hamming left half-encoder C4+ and a Hamming right half-encoder C4−;

FIG. 3a illustrates a first embodiment of the error correction encoding device according to the invention comprising three encoding stages, each comprising three basic encoding modules implementing a compact Hamming code C4 and two permutation stages $\pi 0$;

FIG. 3b presents a transfer matrix P of the encoder of FIG. 3a;

FIG. 4a illustrates a second embodiment of the error correction encoding device according to the invention, comprising three encoding stages, each comprising three basic encoding modules implementing a compact Hamming code C4, a Hamming left half-code C4+, a Hamming right half-code C4− or an identity code with a length of four, and two permutation stages 710;

FIG. 4b presents the transfer matrix P of the encoder of FIG. 4a;

FIG. 5b presents the transfer matrix P of the encoder of FIG. 5a;

FIG. 6b presents the transfer matrix P of the encoder of FIG. 6a;

FIG. 7b presents the transfer matrix P of the encoder of FIG. 7a;

FIG. 8b presents the transfer matrix P of the encoder of FIG. 8a;

DETAILED DESCRIPTION OF ILLUSTRATIVE EMBODIMENTS

1. General Principle

Figure 2C:
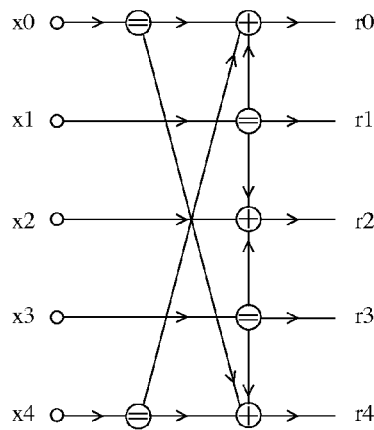
FIGS. 2c, 2d and 2e illustrate three examples of basic encoding modules according to one embodiment of the error correction encoding device of the invention representing 5, 6 and 7 input half-codes.

The general principle of an embodiment of the invention relies on the association of basic encoding modules and c-cyclic type permutations, the basic encoding modules being chosen in such a way that, when combined with c-cyclic type permutations, the resultant code is optimal and self-dual.

It is possible in particular to juxtapose these c-cyclic type permutations, complete bipartite graphs and identity permutations in series and/or in parallel.

It may be recalled that a code is said to be "self-dual" if it is equal to its dual. In other words, any word u of a self-dual code is orthogonal to any word v of the code, including itself. Thus, u.v=0, with a scalar product u.v in the field or ring of the symbols of the code, i.e. for example modulo2.

To this end, the encoding stages are at least three in number and are separated by specific permutations, chosen to let through a maximum of invariant positions and to contain a minimum number of cycles. The codes implemented by the basic encoding modules are also specific and belong to the group comprising the Hamming codes, the Hamming half-codes as defined here below, or the identity codes.

An embodiment of the invention therefore proposes a novel error correction encoding structure that makes it possible, for a given rate, to obtain a code having the greatest minimum distance and the simplest possible implementation, and that enables decoding of lower complexity, i.e. a factorizing of the computations during the encoding and the decoding through a factorizing of the transfer matrices P of the code obtained according to an embodiment of the invention.

It thus makes it possible to simplify the implementation of the existing Cortex encoders as defined in the European patent EP 1 101 288 mentioned here above. This improvement of the Cortex codes makes it possible especially to define new codes, such as the optimal self-dual codes (n=48, k=24) and (n=72, k=36), which may themselves become basic codes to build novel lengthier codes according to a recursive principle of an embodiment of the invention.

An error correction code according to an embodiment of the invention can find application in a large number of fields and especially in the fields listed with reference to the prior art.

2. Definition

2.1 Compact Hamming Code and Hamming Left and Right Half-Codes

FIG. 1a illustrates a particular representation of an (8, 4, 4) Hamming code, called a compact Hamming code C4 which can be implemented in a basic encoding module according to one embodiment of the error correction encoding device of the invention.

This basic encoding module has four inputs x0, x1, x2 and x3 (ce=4), corresponding to source data and four outputs r0, r1, r2 and r3, (cs=4) corresponding to redundancy data, computed as follows:

$$r0=x0+x1+x3$$

$$r1=x0+x1+x2$$

$$r2=x1+x2+x3$$

$$r3=x0+x2+x3$$

The transfer matrix P of this compact Hamming code is illustrated in FIG. 1b where the blank circles correspond to 0 and the black circles correspond to 1.

The weight enumerator polynomial for the rows of this transfer matrix P is equal to $W_p(X)=4X^3$, with a minimum weight $w_{min}=3$ and a minimum distance $d_{min}=4$.

This basic code is self-dual. It therefore guarantees a rate of ½.

Owing to the specific representation adopted, the code that is the dual of this basic code can easily be obtained by replacing the addition operations ("+") by equality operations ("="), and replacing the equality operations ("=") by addition operations ("+"), and by inverting the sense of the arrows. This representation is therefore advantageous.

These representations make it possible also to build two new codes that can be used by the basic encoding modules in cutting the compact Hamming code thus represented into two, along the axis (AA') of FIG. 1a. In this way, we obtain two smaller codes, called a Hamming left half-code denoted as C4+, and a Hamming right half-code denoted as C4−.

The Hamming left half-code C4− is associated with a transfer matrix P+ and the Hamming right half-code C4− is associated with a transfer matrix P− such that P=P+×P−=P−×P+.

These two half-codes are illustrated respectively in FIGS. 2a and 2b.

More specifically, according to this example, the left half-code or has four input bits (x0, x1, x2, x3) (ce=4) and four output bits (r'0, r'1, r'2, r'3) (cs=4).

The right half-code C4⁻ has four input bits (r"0, r"1, r"2, r"3) (ce=4) and four output bits (r0, r1, r2, r3) (cs=4).

The right half-code C4⁻ is the dual code of the left half-code C4⁺ (primal), with (ce)=(cs)=4.

These two left half-code C4⁺ and right half code C4⁻ can be grouped together by directly connecting the outputs (r'0, r'1, r'2, r'3) of the left half-code C4⁺ to the inputs (r"0, r"1, r"2, r"3) of the right half-code C4⁻, to form a compact Hamming code C4.

In this example, the left half-code of the Hamming code C4 is defined by a 2-cyclic pattern such that:

$$x(2i-1)+x(2i)+x(2i+1) \text{ gives } r'(i)$$

and $$x(2i+1) \text{ gives } r'(2i+1),$$

with the indices i computed modulo the length (ce), giving four for the Hamming code C4(8,4,4).

Thus:

for i=0:

$$r'0=x(-1)+x(0)+x(1)=x3+x0+x1$$

$$r'1=x1$$

for i=1:

$$r'2=x(1)+x(2)+x(3)=x1+x2+x3$$

$$r'3=x3.$$

In other embodiments, it is possible to have basic codes having a number of inputs (ce) different from the number of outputs (cs).

Similarly, this "compact" representation of the Hamming code can be extended to a number of inputs or outputs different from four.

A general formula used to build basic left half-codes and basic right half-codes having c inputs and outputs can be expressed as follows:

for the even indices (2i) with 0≤2i≤(c−1):

$$r_{2i} = \sum_{j=-m}^{j=+m} x_{2i+j}, \text{ where } m = \left\lfloor \frac{\text{degree}}{2} \right\rfloor$$

the operator Σ is the sum modulo 2 operator, also called an "exclusive OR" and where the degree corresponds to the number of inputs of the "exclusive OR" operator (the degree is always an odd value);

for the odd indices (2i+1) with 1≤2i+1≤(c−1):

$$r_{2i+1}=x_{2i+1}.$$

For example, it is possible to build a half-code with five inputs and five outputs illustrated in FIG. 2c such that:

$$r0=x4+x0+x1$$

$$r1=x1$$

$$r2=x1+x2+x3$$

$$r3=x3$$

$$r4=x3+x4+x0$$

Figure 2D:
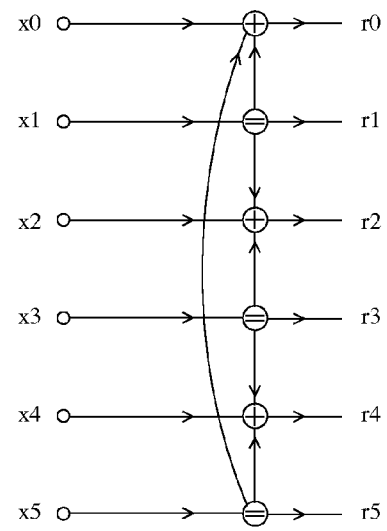
Figure 2E:
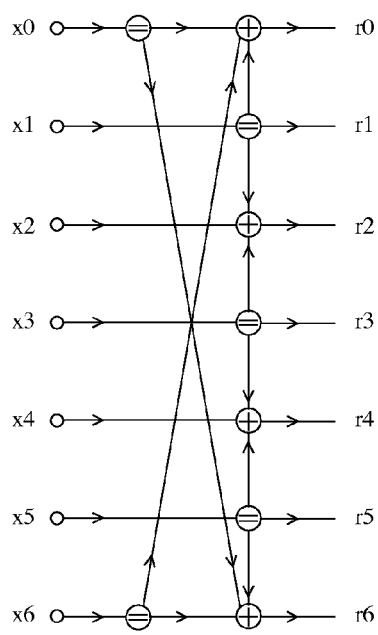

Or again, a half-code with six inputs and six outputs as illustrated in FIG. 2d can be obtained and expressed as follows:

$$r0=x5+x0+x1$$

$$r1=x1$$

$$r2=x1+x2+x3$$

$$r3=x3$$

$$r4=x3+x4+x5$$

$$r5=x5$$

Another example of a half-code is illustrated in FIG. 2f. It has seven inputs and seven outputs and can be expressed thus:

$$r0=x6+x0+x1$$

$$r1=x1$$

$$r2=x1+x2+x3$$

$$r3=x3$$

$$r4=x3+x4+x5$$

$$r5=x5$$

$$r6=x5+x6+x0$$

2.2 C-Cyclique Type Permutation $\pi_{\Delta,k}$

A c-cyclic type permutation is a permutation that is invariant for positions that are multiples of c. In other words, a same pattern of permutation is applied to each block with a length c.

For example, we consider a 4-cyclic type permutation as illustrated in FIG. 3a, taking at input symbols at the positions 0, 1, 2, 3, 4, 5, 6, 7, 8, 9, 10 and 11, and delivering these same symbols at the positions 11, 1, 2, 4, 3, 5, 6, 8, 7, 9, 10 and 0 respectively. It is observed, according to a first permutation pattern, that the symbols at the positions (1, 2, 3, 4) are sent to the positions (1, 2, 4, 3), the symbols at the positions (5, 6, 7, 8) are sent to the positions (5, 6, 8, 7), and the symbols at the positions (9, 10, 11, 0) are sent to the positions (9, 10, 0, 11). The symbols at the positions (i, i+1, i+2, i+3) are therefore sent to the positions (i, i+1, i+3, i+2) according to this first pattern. According to another permutation pattern, the symbols at the positions (2, 3, 4, 5) are sent to the positions (2, 4, 3, 5), the symbols at the positions (6, 7, 8, 9) are therefore sent to the positions (6, 8, 7, 9), and the symbols at the positions (i, i+1, i+2, i+3) are sent to the positions (10, 0, 11, 1). The symbols at the positions (i, i+1, i+2, i+3) are therefore sent to the positions (i, i+2, i+1, i+3) according to this second pattern.

Therefore, a same permutation pattern is complied with for each block with a length c=4.

A c-cyclic type permutation can be written in the following form:

$$\forall i = 0, 1, \ldots, (k-1) \begin{cases} \pi_{\Delta,k}(i) = \Delta_0 + i(\text{mod}k) & \text{if } i \equiv 0(\text{mod}c) \\ \pi_{\Delta,k}(i) = \Delta_1 + i(\text{mod}k) & \text{if } i \equiv 1(\text{mod}c) \\ \vdots & \vdots \\ \pi_{\Delta,k}(i) = \Delta_{c-1} + i(\text{mod}k) & \text{if } i \equiv (c-1)(\text{mod}c), \end{cases}$$

with $\Delta=\{\Delta_0, \Delta_1, \ldots, \Delta_{c-1}\}$ being a set of integer parameters (added to or deducted from the index of an output symbol from the c-cyclic permutation in order to find the index of this symbol at the input of the permutation). The following restrictions must be applied to the set d of the integer parameters:
1. the parameters $(\Delta_0, \Delta_1, L, \Delta_{c-1})$ of a set $\Delta$ should take at least three different values. For example, for the case c=4: $(\Delta_0, \Delta_1, \Delta_2, \Delta_3)=(-1,0,0,+1)$ and
2. exceptionally, when the parameters $(\Delta_0, \Delta_1, L, \Delta_{c-1})$ of a set $\Delta$ take only two different values, then each of the two values is present at least twice in the set. For example, when c=4: $(\Delta_0, \Delta_1, \Delta_2, \Delta_3)=(-1, -1, +1, +1)$ enables the definition of a 4-cyclic permutation whereas $(\Delta_0, \Delta_1, \Delta_2, \Delta_3)=(n, 0, 0, 0)$, with n being a non-zero relative integer, is excluded because the value of "n" is present only once in the set $\Delta$. A quadruplet of this kind does not give good total codes (with a great minimum distance) with a minimum number of stages.

The use of this c-cyclic permutation simplifies the implementation of the error correction encoding device by reducing the number of components to be used.

Furthermore, this c-cyclic type permutation limits the memory access operations for the invariant bits which are left in their memory position. The computations of addresses are also minimized because the unnecessary data addresses are re-used.

2.3 Permutation of Complete Bipartite Graphs $\pi_{Bk}$

These permutations have a role of mixing or scrambling information at input or at output of the basic encoding modules.

Such a permutation can be written in the following form:

$$\pi_{Bk}(i) = \left\lfloor \frac{i}{p} \right\rfloor + c*(i \bmod p) \forall\ i = 0, 1, \ldots, (k-1), \text{ with } p = \left\lfloor \frac{k}{c} \right\rfloor,$$

(where the operator $\lfloor . \rfloor$ designates the integer part)

3. Description of a First Embodiment

Referring now to FIGS. 3a and 3b, we present a first embodiment of the encoding device according to the invention.

FIG. 3a illustrates the structure of an encoder according to an embodiment of the invention taking pieces of source data (x0, x1, x2 . . . x11) at input and delivering pieces of redundancy data (r0, r1, r2 . . . r11) at output.

These pieces of redundancy data can then be used, in combination with the source data, to form a code word.

The encoder thus made has three encoding stages cA, cB and cC, and two permutation stages $\pi 0$. Each encoding stage has three basic encoding modules: (A0, A1, A2) for the first encoding stage cA, (B0, B1, B2) for the intermediate encoding stage cB and (C0, C1, C2) for the last encoding stage cC.

The numbers indicated at input and output of the permutation stages nO define the position of the symbols at input at a permutation stage and their corresponding position at output.

According to this first embodiment, each basic encoding module corresponds to the encoder C4 illustrated in FIG. 1a, implementing a compact Hamming code as described here above.

Furthermore, the $\pi 0$ permutations used are 4-cyclic type permutations with a parameter $\Delta=1$ (which limits the cross operations), which are described by a minimum number of cycles and therefore a maximum number of invariant positions (represented by horizontal lines in the permutation stages), thus reducing computations and memory access operations.

This encoder gives a code with a length n equal to 24, with k equal to 12 payload information symbols and a minimum distance dmin equal to 8.

The use of a (8, 4, 4) Hamming code C in the set of base encoding modules makes it possible especially to obtain an upper bound for the minimum distance for the final code built which reaches the minimum bound Bmin, defined by:

$$d_{min} \leq B\min = 4 \left\lfloor \frac{n}{24} \right\rfloor + 4.$$

This code obtained by a Cortex building according to an embodiment of the invention is here below called a simplified Cortex-Golay code (24, 12, 8). In other words, an embodiment of the invention enables the rebuilding of a Golay code by using a simplified structure based on Hamming codes. The transfer matrix P of the final code obtained is illustrated in FIG. 3b.

The weight enumerator polynomial for the weights of the rows of this matrix P is equal to: $W_p(X)=12X^7$, with a minimum weight $w_{min} \leq 7$ and a minimum distance $d_{min} \leq 8$.

The rows of minimum weights $w_{min}$ are used to indicate the minimum distance $d_{min}$ of the codes built according to an embodiment of the invention as follows:

$$d_{min} \leq (w_{min}+1).$$

This is a very rare property for a family of codes in which it becomes particularly simple to compute the minimum distance $d_{min}$ from the length n, which is a multiple of 24, of the code. Indeed, it is enough to compute the weight of the k rows of the transfer matrix P of the code instead of exhaustively computing the $2^k$ words of the code.

4. Description of a Second Embodiment

Referring now to FIGS. 4a and 4b, we present a second embodiment of the encoding device according to the invention.

FIG. 4a illustrates an encoder according to an embodiment of the invention taking the pieces of data (x0, x1, x2 . . . x11 at input) and delivering the pieces of redundancy data (r0, r1, r2 r11) at output. Again, these pieces of redundant data can be used in combination with the source data to form a code word.

The encoder thus made includes three encoding stages cA, cB et cC, and two permutation stages $\pi 0$. Each encoding stage has three basic encoding modules: the first encoding stage cA implements three Hamming left half-codes C4$^+$ (A0, A1, A2), the intermediate encoding stage cB implements two compact Hamming codes C4 (B0, B2) and one identity code Id4, the last encoding stage cC implements three Hamming right half-codes C4$^-$ (C0, C1, C2).

As in the embodiment described here above, the permutations $\pi 0$ used are 4-cyclic permutations with a parameter $\Delta=1$, described by a minimum number of cycles and therefore a maximum number of invariant positions (represented by horizontal lines in the permutation stages), thus reducing the computations and memory access operations.

By contrast, in this embodiment, the encoding stages do not all implement codes of a same type.

Indeed, the first encoding stage cA has three basic encoding modules (A0, A1, A2) each implementing a Hamming left half-code C4$^+$ type code as described here above.

This Hamming left half-code is not self-dual. Hence, in order to maintain this property for the "total" or final code built, the last encoding stage cC also includes three basic encoding modules (C0, C1, C2) each implementing a Hamming right half-code C4− type code.

The joining of these two encoding stages cA and cC comprising basic encoding modules implementing Hamming left half-codes and Hamming right half-codes is equivalent to an encoding stage comprising basic encoding modules implementing compact Hamming codes.

The use of Hamming left half-codes and Hamming right half-codes provides for greater flexibility in the building of the final code and in particular makes it possible to obtain a greater number of codes.

The intermediate encoding stage cB for its part comprises two basic encoding modules (B0, B2) implementing a compact Hamming code C4 and a basic encoding module implementing an identity code Id4.

This diversity of basic codes C4+, C4, Id4 and C4− enables the building of practically all optimal self-dual codes but also those that are not optimal. However, the choice is made according to the minimum weight of the rows of their transfer matrices P, which gives a limit of the weights of the non-zero words of the code.

This encoder implements the same permutation pattern $\pi 0$ of a 4-cyclic type as the one described in the previous embodiment, i.e. a 4-cyclic type permutation with a parameter $\Delta=1$.

The transfer matrix P of this code is illustrated in FIG. 4b.

The weight enumerator polynomial for the rows of this matrix P is equal to: $Wp(X)=2X^3+2X^5+6X^7+2X^9$, with a minimum weight $w_{min}=3$ and a minimum distance et $d_{rain} \leq 4$.

5. Description of a Third Embodiment

Figure 5A:
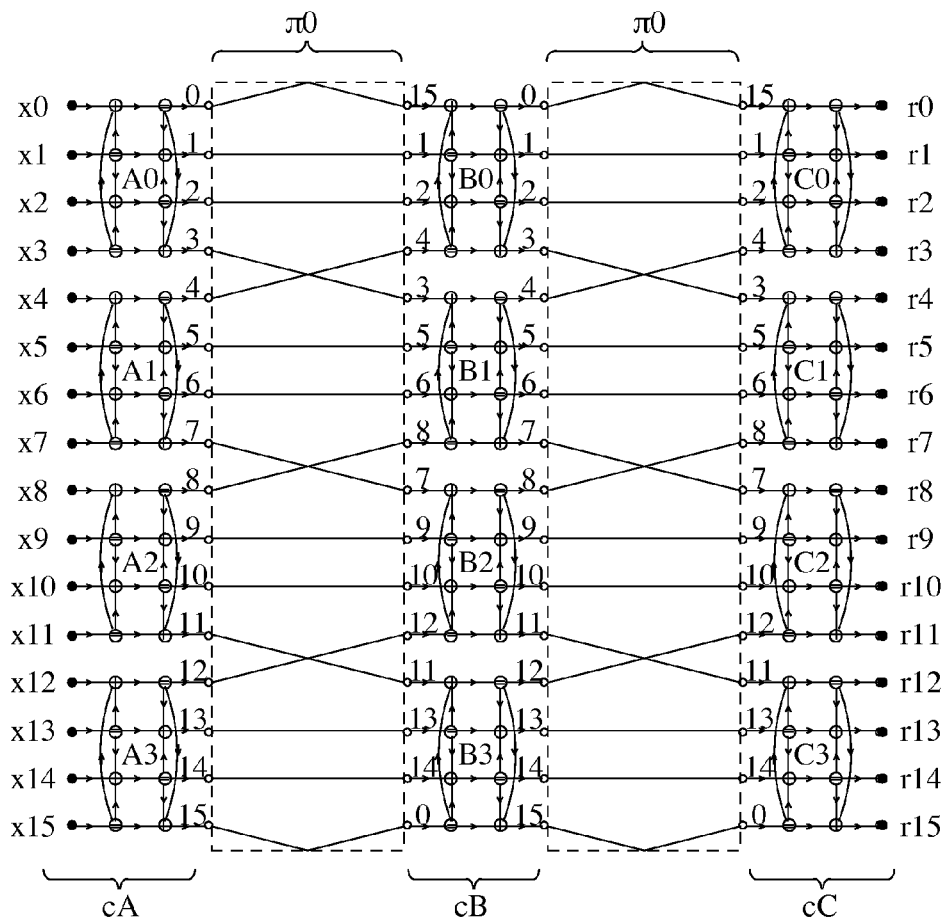
FIG. 5a illustrates a third embodiment of an error correction encoding device according to the invention comprising three encoding stages, each comprising four basic encoding modules implementing a compact Hamming code C4 and two permutation stages $\pi 0$.
Figure 5B:
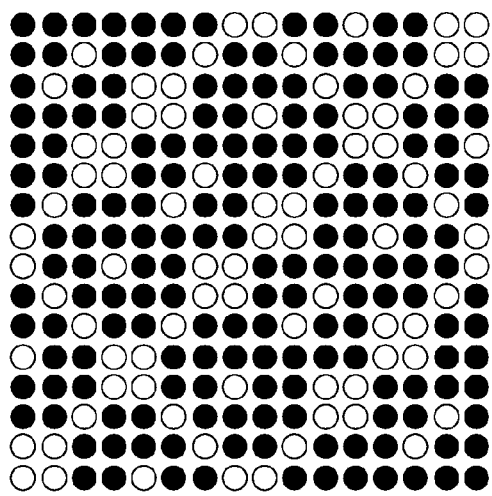

Referring now to FIGS. 5a and 5b, we present a third embodiment of the encoding device according to the invention.

FIG. 5a illustrates an encoder of this kind according to an embodiment of the invention, taking the pieces of data (x0, x1, x2 ... x15) at input and delivering the pieces of redundancy data (r0, r1, r2 ... r15) at output.

The encoder thus made has three encoding stages cA, cB and cC, each comprising four basic encoding modules (A0, A1, A2, A3), (B0, B1, B2, B3) and (C0, C1, C2, C3), each implementing a compact Hamming code C4, and two permutation stages $\pi 0$.

This encoder implements the same 4-cyclic type permutation pattern $\pi 0$ as the one described in the first embodiment, i.e. a 4-cyclic type permutation with a parameter $\Delta=1$.

The length of this code is equal to 32, i.e. 4/3 of the length of "simplified" Cortex-Golay code $C_1(24, 12, 8)$ described here above, and the minimum distance $d_{min}$ of this code is identical to that of the "simplified" Cortex-Golay code $C_1(24, 12, 8)$ described here above.

An embodiment of the invention therefore makes it possible to derive, from a Cortex construction code, a lengthier Cortex code having the same minimum distance $d_{min}$.

The transfer matrix P of this code is illustrated in FIG. 5b.

The weight enumerator polynomial for the rows of this matrix P is equal to $W_p(X)=16X^{11}$, with a minimum weight $w_{min}=11$ and a minimum distance $d_{min} \leq 12$. However, since this code is derived from the "simplified" Cortex-Golay code $C_1(24, 12, 8)$ described here above, we get $d_{min}=8$.

6. Description of a Fourth Embodiment

Figure 6A:
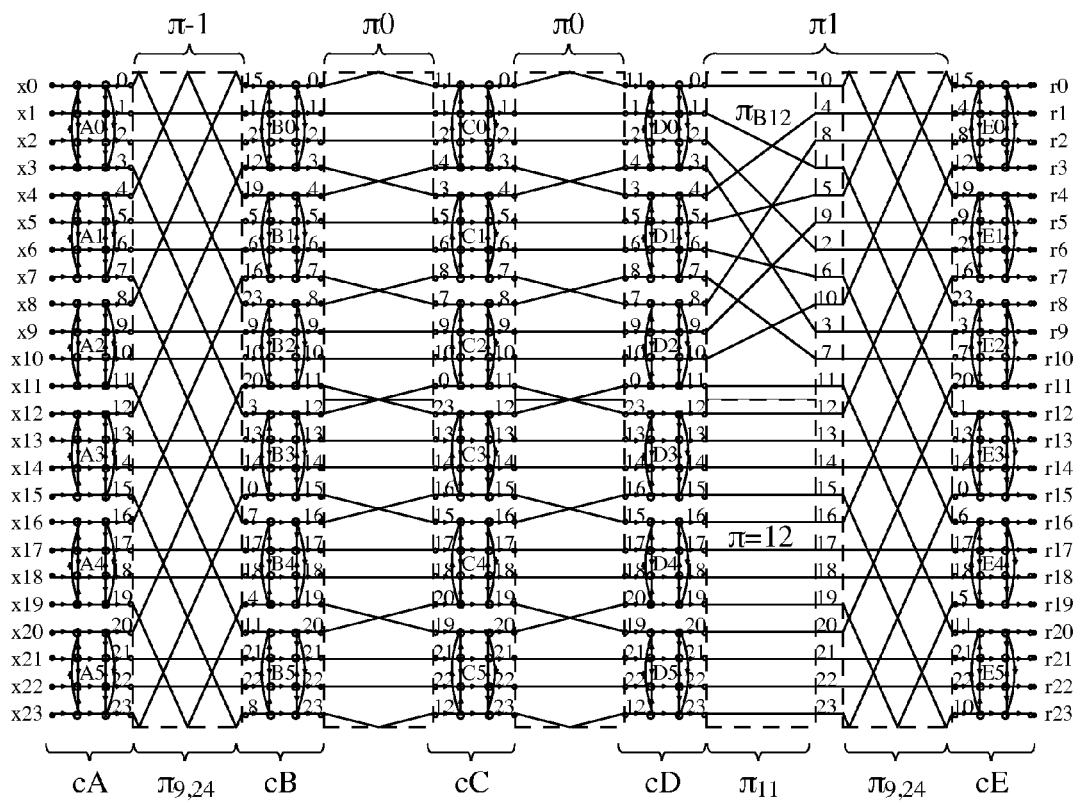
FIG. 6a illustrates a fourth embodiment of the error correction encoding device according to the invention comprising five encoding stages each comprising six basic encoding modules implementing a compact Hamming code C4, two permutation stages $\pi 0$, one prior scrambling stage $\pi-1$ and one posterior scrambling stage $\pi 1$.
Figure 6B:
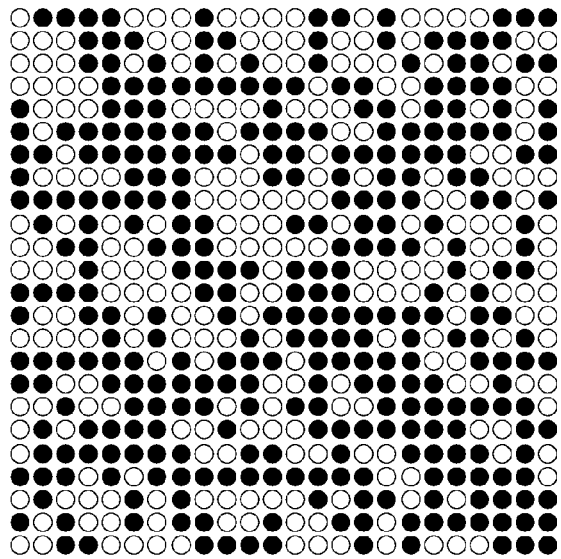

Referring now to FIGS. 6a and 6b, we present a fourth embodiment of an encoding device according to the invention.

FIG. 6a illustrates an encoder according to an embodiment of the invention, taking the pieces of data (x0, x1, x2 ... x23) at input and delivering the pieces of redundancy data (r0, r1, r2 ... r23) at output.

The encoder thus made includes five encoding stages cA, cB, cC, cD and cE, each comprising six basic encoding modules (A0, A1, A2, A3, A4, A5), (B0, B1, B2, B3, B4, B5), (C0, C1, C2, C3, C4, C5), (D0, D1, D2, D3, D4, D5) and (E0, E1, E2, E3, E4, E5) each implementing a compact Hamming code C4, two permutation stages $\pi 0$, a prior scrambling stage $\pi-1$ (also denoted as $\pi_{9,24}$) and a posterior scrambling stage $\pi 1$, itself consisting of two scrambling sub-stages $\pi 11$ and $\pi_{=9,24}$. The first posterior scrambling sub-stage $\pi 11$ comprises two distinct scrambling modules known as $\pi_{B12}$ and $\pi_{=12}$, implementing distinct scrambling operations.

It can be noted that this encoder has two encoders implementing codes previously called "simplified" Cortex-Golay codes $C_1(24, 12, 8)$ identified in FIG. 6a respectively by the basic encoding modules (B0, B1, B2), (C0, C1, C2), (D0, D1, D2) for the top Cortex-Golay encoder $C_1(24, 12, 8)$ and (B3, B4, B5), (C3, C4, C5), (D3, D4, D5) for the bottom Cortex-Golay encoder $C_1(24, 12, 8)$ and the permutations $\pi 0$ (of the 4-cyclic type with a parameter $\Delta=1$).

Furthermore, the outputs of the top Cortex-Golay $C_1(24, 12, 8)$ encoder enter the first scrambling module $\pi_{B12}$, implementing the following scrambling operation:

$$\pi_{Bk}(i) = \left\lfloor \frac{i}{p} \right\rfloor + 4*(i \bmod p) \forall\ i = 0, 1, \ldots, (k-1), \text{ with } p = \left\lfloor \frac{k}{4} \right\rfloor.$$

For example, for k equal to 12, as illustrated in FIG. 6a, p is equal to 3 and we obtain the following positions at output of the first scrambling module: $\pi_{B12}=\{0, 4, 8, 1, 5, 9, 2, 6, 10, 3, 7, 11\}$.

The outputs of the bottom Cortex-Golay $C_1(24, 12, 8)$ encoder for their part enter the second scrambling module $\pi_{=12}$, implementing an identity scrambling, i.e. an absence of scrambling.

The use of these two distinct types of scrambling in a same scrambling sub-stage $\pi 11$ of the posterior scrambling stage $\pi 1$, is fundamental for obtaining a great diversity of resultant codes.

The second scrambling sub-stage $\pi_{9,24}$ of the posterior scrambling stage $\pi 1$ implements a 4-cyclic type permutation with a parameter $\Delta$ equal to 9 and a length k equal to 24.

The prior scrambling stage $\pi-1$ also implements a 4-cyclic type of permutation with a parameter $\Delta$ equal to 9 and a length k equal to 24.

It is thus possible to express the different permutations implemented in the building of this encoder, denoted as a $C_2(48, 24)$ Cortex encoder as follows:

$$\pi(C_2)=\{\pi_{9,24},\pi_{1,12}*\pi_{1,12},\pi_{1,12},(\pi_{B12}*\pi_{=12})\circ\pi_{9,24}\},$$

or, with a simplified notation: $C_2=(C_1*C_1, \Delta_1=9)$, with * being the operator superimposing permutations and ○ being the operator that concatenates permutations.

The term "superimposing" two permutations (in parallel) refers to the fact of positioning these permutations vertically one on top of the other, i.e. placing them in parallel. For example, the superimposition or the positioning in parallel of two identity permutations Id4={0, 1, 2, 3} gives an identity permutation Id8 such that:

$$Id4*Id4=Id8, \text{ i.e } \{0,1,2,3\}*\{0,1,2,3\}=\{0,1,2,3,4,5,6,7\}.$$

The term "concatenate" two permutations (in series) refers to the fact of positioning them horizontally, i.e. putting them in series. For example, the concatenation or the serial connection of two permutations $\pi 0=\{1,2,3,0\}$ and $\pi 1=\{3,0,1,2\}$ gives an identity permutation Id4 such that:

$\pi 0 \circ \pi 1 = Id4$, i.e. $\{1,2,3,0\} \circ \{3,0,1,2\} = \{0,1,2,3\}$.

The transfer matrix P of this $C_2(48, 24)$ Cortex code is illustrated in FIG. 6b.

The weight enumerator polynomial for the rows of this matrix P is equal to: $W_p(X)=12X^{11}+8X^{15}+4X^{19}$, with a minimum weight $w_{min}=11$ and a minimum distance $d_{min} \leq 12$.

7. Description of a Fifth Embodiment

Figure 7A:
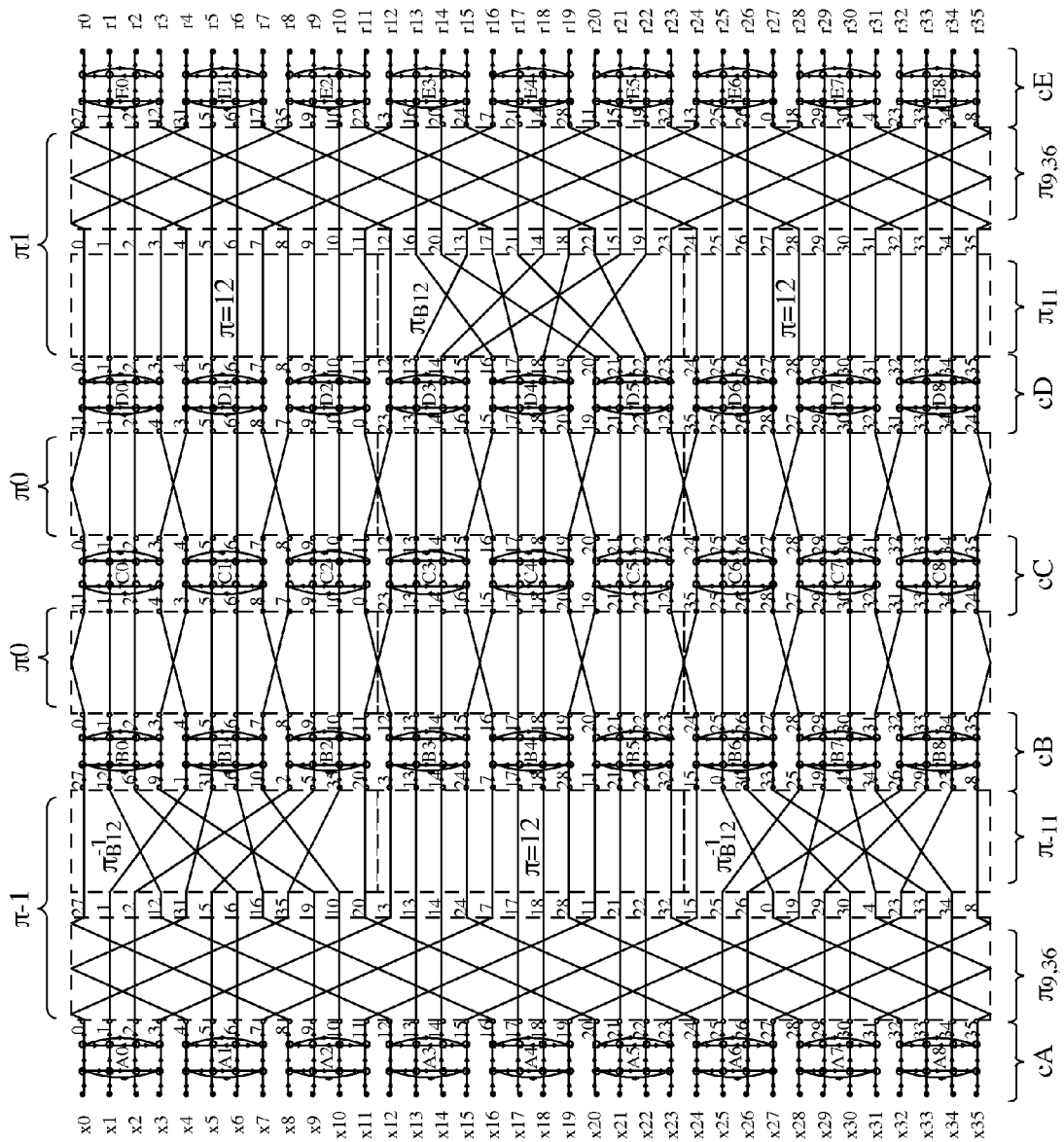
FIG. 7a illustrates a fifth embodiment of the error correction encoding device according to the invention comprising five encoding steps each comprising nine basic encoding modules implementing one compact Hamming code C4, two permutation stages $\pi 0$, one prior scrambling stage $\pi-1$ and one posterior scrambling stage $\pi 1$.
Figure 7B:
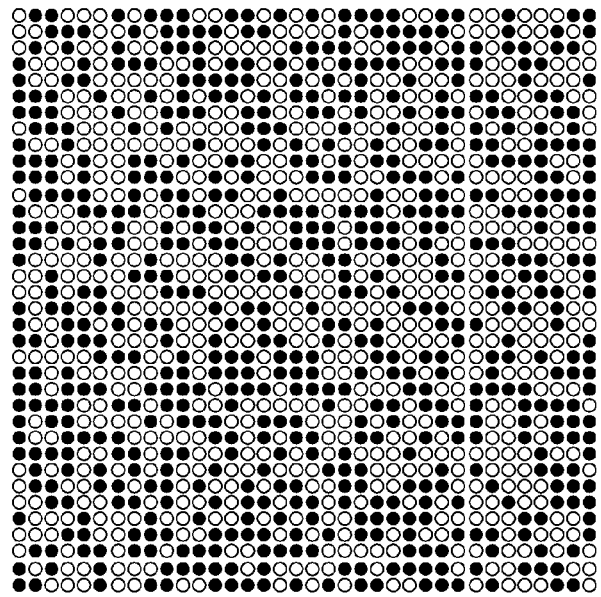

Referring now to FIGS. 7a and 7b, we present a fifth embodiment of the encoding device according to the invention.

FIG. 7a illustrates an encoder according to an embodiment of the invention taking the pieces of data (x0, x1, x2 ... x35) at input and delivering the pieces of redundancy data (r0, r1, r2 ... r35) at output.

The encoder thus made comprises five encoding stages cA, cB, cC, cD and cE, each comprising nine basic encoding modules (A0 ... A8), (B0 ... B8, (C3 ... C8), (D0 ... D8), (E0 ... E8) each implementing a compact Hamming code C4, two permutation stages $\pi 0$, one prior scrambling stage $\pi-1$ and one posterior scrambling stage $\pi 1$.

The prior scrambling stage $\pi-1$ has two prior scrambling sub-stages respectively denoted as $\pi_{9,36}$ and $\pi-11$.

The second prior scrambling sub-stage $\pi-11$ comprises three scrambling modules, of which two modules implement a scrambling denoted as $\pi_{B12}^{-1}$, and one module implements an identity scrambling $\pi_{=12}$.

The posterior scrambling stage $\pi 1$ has two posterior scrambling sub-stages respectively denoted as $\pi 11$ and $\pi_{9,36}$.

The first posterior scrambling sub-stage $\pi 11$ comprises three scrambling modules, of which two modules implement an identity scrambling $\pi_{=12}$ and one module implements a scrambling $\pi_{B12}$.

It can be noted that this encoder has three encoders implementing codes here above called "simplified" $C_1(24, 12, 8)$ Cortex-Golay codes identified in FIG. 7a respectively by the basic encoding modules (B0, B1, B2), (C0, C1, C2), (D0, D1, D2) for the top $C_1(24, 12, 8)$ Cortex-Golay encoder, (B3, B4, B5), (C3, C4, C5), (D3, D4, D5) for the middle $C_1(24, 12, 8)$ Cortex-Golay encoder, and (B6, B7, B8), (C6, C7, C8), (D6, D7, D8) for the bottom $C_1(24, 12, 8)$ Cortex-Golay encoder, and the permutations $\pi 0$ (of the 4-cyclic type with the parameter $\Delta=1$).

The outputs of the top $C_1(24, 12, 8)$ Cortex-Golay encoder enter the first scrambling module $\pi_{=12}$ of the first posterior scrambling sub stage $\pi 11$ implementing an identity scrambling (or an absence of scrambling).

The outputs of the middle $C_1(24, 12, 8)$ Cortex-Golay encoder enter the second scrambling module $\pi_{B12}$ of the first posterior scrambling sub-stage $\pi 11$ implementing the following scrambling:

$$\pi_{Bk}(i) = \left\lfloor \frac{i}{p} \right\rfloor + 4*(i \bmod p) \forall\ i = 0, 1, \ldots, (k-1), \text{with } p = \left\lfloor \frac{k}{4} \right\rfloor.$$

For example, for k equal to 12, as illustrated in FIG. 7a, p is equal to 3 and the following positions are obtained at output of the second scrambling module: $\pi_{B12}=\{0, 4, 8, 1, 5, 9, 2, 6, 10, 3, 7, 11\}$.

The outputs of the bottom $C_1(24, 12, 8)$ Cortex-Golay encoder for their part enter the third scrambling module $\pi_{=12}$ of the first posterior scrambling sub-stage $\pi 11$ implementing an identity scrambling.

The use of these distinct scrambling modules in a same posterior scrambling sub-stage $\pi 11$ of the posterior scrambling stage $\pi 1$, is fundamental for obtaining a great diversity of resultant codes.

The second scrambling sub-stage $\pi_{9,36}$ of the posterior scrambling stage $\pi 1$ implements a 4-cyclic type permutation with a parameter $\Delta$ equal to 9 and a length k equal to 36.

The prior scrambling stage $\pi-1$ implements two different prior scrambling sub-stages $\pi_{9,36}$ and $\pi-11$.

The first prior scrambling sub-stage $\pi_{9,36}$ implements a 4-cyclic type permutation with a parameter $\Delta$ equal to 9 and a length k equal to 36, identical to the posterior scrambling sub-stage denoted as $\pi_{9,36}$.

The second prior scrambling sub-stage $\pi-11$ for its part implements two different types of permutation in these three scrambling modules: the permutation $\pi_{B12}^{-1}$ implementing a scrambling in reverse to the scrambling defined for $\pi_{12}$, and the identity permutation $\pi_{=12}$.

It is thus possible to express the different permutations implemented in the building of this encoder, denoted as a Cortex $C_3(72, 36)$ encoder as follows:

$\pi(C_3)=\{\pi_{-1},\pi_0,\pi_0,\pi_1\}$, with:

$\pi_{-1}=\pi_{9,36} \circ (\pi_{B12}^{-1} * \pi_{=12} * \pi_{B12}^{-1})$ and $\pi_1=(\pi_{=12} * \pi_{B12} * \pi_{=12}) \circ \pi_{9,36}$ or, with a simplified notation: $C_3=(C_1 * C_1 * C_1, \Delta_1=9)$, with * being this operator superimposing permutations and
∘ being the operator concatenating permutations.

The permutations $\pi 0$ are of a 4-cyclic type with a parameter $\Delta=1$.

The transfer matrix P of this $C_3(72, 36)$ Cortex code is illustrated in FIG. 7b.

The weight enumerator polynomial for the rows of this matrix P is equal to: $W_p(X)=12X^{15}+22^{19}+2X^{33}$, with a minimum weight $w_{min}=15$ and a minimum distance $d_{min} \leq 16$.

8. Description of a Sixth Embodiment

Figure 8B:
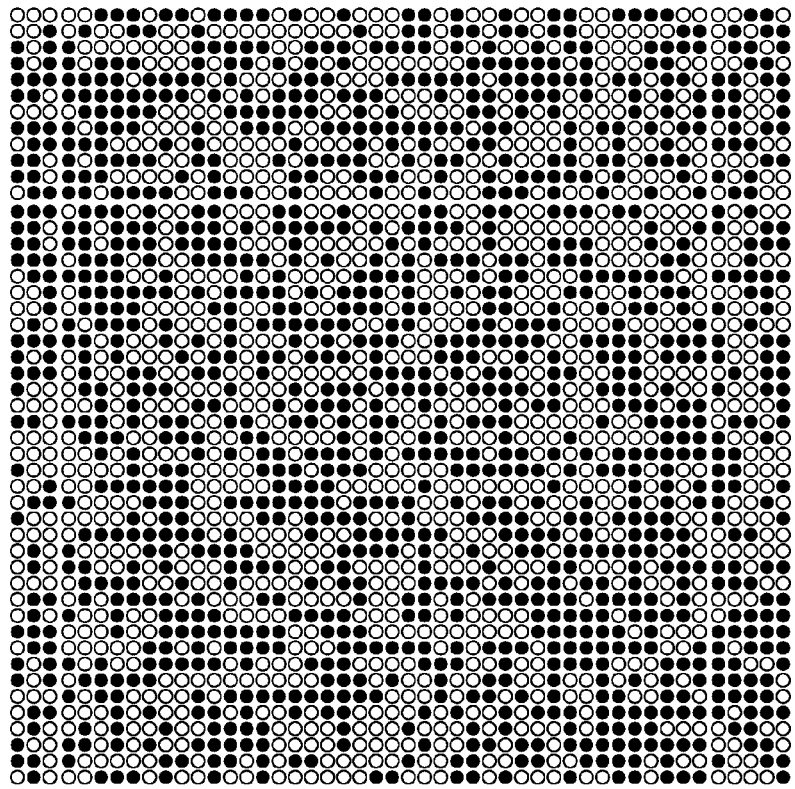
Figure 8A:
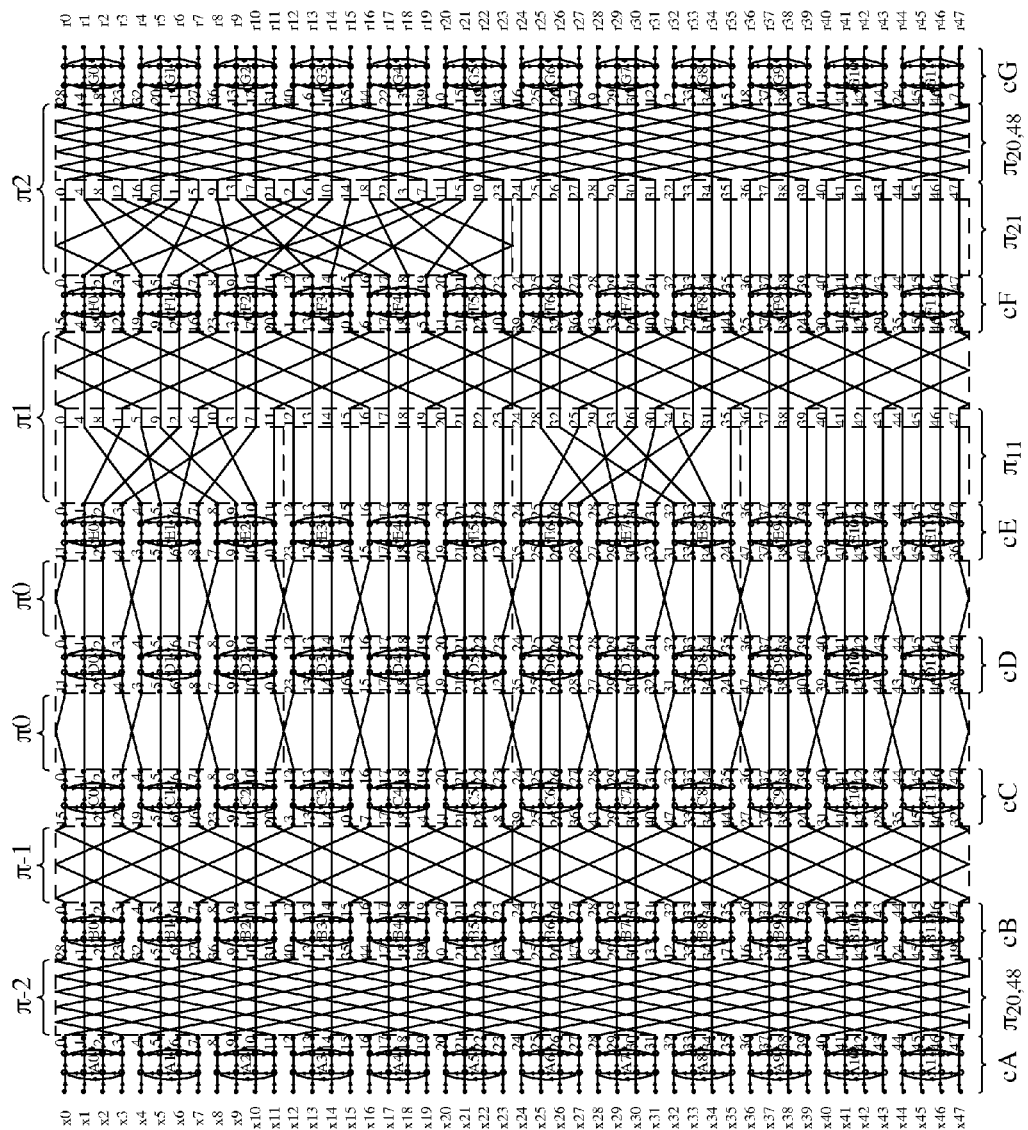
FIG. 8a illustrates a sixth embodiment of the error correction encoding device according to the invention comprising seven encoding stages each comprising twelve basic encoding modules implementing a compact Hamming code C4, two permutation stages $\pi 0$, two prior scrambling stages $\pi-2$ and $\pi-1$ and two posterior scrambling stages $\pi 1$ and $\pi 2$.

Referring now to the FIGS. 8a and 8b, we present a sixth embodiment of the encoding device according to the invention.

FIG. 8a illustrates an encoder according to an embodiment of the invention, taking the pieces of data (x0, x1, x2 ... x47) at input and delivering the pieces of redundancy data (r0, r1, r2 r47) at output.

The encoder thus made comprises seven encoding stages cA, cB, cC, cD, cE, cF and cG, each including twelve basic encoding modules (A0 ... A11), (B0 ... B11), (C0 ... C11), (D0 ... D11), (E0 ... E11), (F0 ... F11), (G0 ... G11) each implementing a compact Hamming code C4, two permutation stages $\pi 0$, two prior scrambling stages $\pi-2$ and $\pi-1$ and two posterior scrambling stages $\pi 1$ and $\pi 2$.

It can be noted that this encoder, called a $C_4(96, 48, d_{min} \leq 20)$ Cortex encoder, comprises two $C_2(48, 24)$ encoders (illustrated in FIG. 6a).

The first prior scrambling stage $\pi 2$ implements a permutation $\pi_{20,48}$ of a 4-cyclic type with a parameter $\Delta$ equal to 20 and a length k equal to 48.

The second prior scrambling stage $\pi-1$ implements a superimposition of two permutations $\pi_{9,24}$ as defined with reference to FIG. 6a.

The first posterior scrambling stage π1 comprises two posterior scrambling sub-stages:
  the first posterior scrambling sub-stage π11 comprises four scrambling modules including two modules implementing an identity scrambling $\pi_{=12}$ and two modules implementing a scrambling $\pi_{B12}$ as described with reference to FIG. 6a;
  the second posterior scrambling sub-stage implements a scrambling $(\pi_{9,24})^{2*}=(\pi_{9,24})*(\pi_{9,24})$.

The second posterior scrambling stage π2 also has two posterior scrambling sub-stages π21 and $\pi_{20,48}$:
  the scrambling sub-stage π21 comprises two scrambling modules implementing distinct permutations, including one module implementing a permutation $\pi_{B24}$ and one module implementing an identity permutation $\pi_{=24}$.

It is thus possible to express the different permutations implemented in the building of this $C_4(96, 48, d_{min} \leq 20)$ Cortex encoder as follows:

$$\pi_{-2} = \pi_{20,48}$$

$$\pi_{-1} = (\pi_{9,24})^{2*}$$

$$\pi_1 = (\pi_{B12}*\pi_{=12})^{2*} \circ (\pi_{9,24})^{2*}$$

$$\pi_2 = (\pi_{B24}*\pi_{=24}) \circ \pi_{20,48}.$$

In a simplified manner, the following notation is used: $C_4 = (C_2*C_2, \Delta_2=20)$.

The permutations π0 are of the 4-cyclic type with a parameter Δ=1.

The transfer matrix P of the $C_4(96, 48, d_{min} \leq 20)$ Cortex code is illustrated in FIG. 8b.

The weight enumerator polynomial for the rows of this matrix P is equal to: $W_p(X) = 7X^{19} + 17X^{23} + 19X^{27} + 4X^{31} + X^{35}$, with a minimum weight $w_{min} = 19$ and a minimum distance $d_{min} \leq 20$.

9. Description of Other Embodiments

A seventh embodiment of the invention is used to obtain an encoder known as a $C_8(192, 96, d_{min} \leq 36)$ Cortex encoder, formed especially by two $C_4(96, 48)$ Cortex encoders as described here above.

This $C_8(192, 96, d_{min} \leq 36)$ Cortex encoder can be written in a simplified way: $C_8 = (C_4*C_4, \Delta_3 = 40)$.

The weight enumerator polynomial for the rows of this matrix P is equal to: $W_p(X) = X^{35} + 6X^{39} + 22X^{43} + 27X^{47} + 29X^{51} + 10X^{55} + X^{59}$, with a minimum weight $w_{min} = 35$ and a minimum distance $d_{min} \leq 36$.

Appendix 1, which is an integral part of the present description presents a table of examples of parameters of encoders obtained according to different embodiments of the invention.

It is thus noted that an embodiment of the invention enables the building of novel codes by using basic encoding modules and specific permutations.

The embodiments described in detail here above with reference to FIGS. 1 to 8 can also be described in the form of error correction encoding methods. The codes built according to the proposed technique can indeed be implemented in various ways, especially in wired form or in software form.

Figure 9:
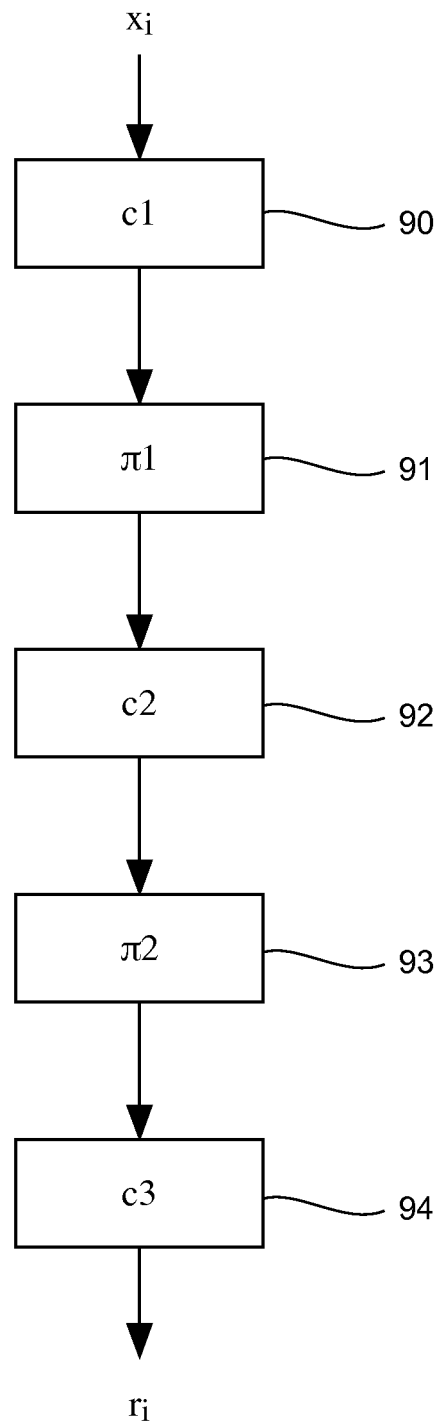
FIG. 9 illustrates the main steps of an encoding method according to one embodiment of the invention.

Thus, FIG. 9 presents the main steps of an error correction encoding method according to one embodiment of the invention, taking source data $x_i$ at input and delivering redundancy data $r_i$ at output.

The first c1 encoding step 90 receives the source data $x_i$ and implements a set of three basic encoding modules, each encoding module implementing a basic code. The basic code may be for example a compact Hamming code or a Hamming half-code as described here above.

The pieces of processed data coming from this first encoding step 90 are then permutated at a π1 permutation step 91. The π1 permutation is a c-cyclic type permutation as defined here above.

The pieces of permutated data are then processed at a c2 intermediate encoding step 92 also implementing a set of three basic encoding modules, each encoding module implementing a basic code.

The processed data elements coming from this second encoding step 92 are then again permutated in a c-cyclic type π1 permutation step 93.

Finally, the permutated data elements are processed in a final c3 encoding step 94, also implementing a set of three basic encoding modules, each encoding module implementing a basic code. The pieces of data coming from this last encoding step 94 are the pieces of redundancy data $r_i$.

An error correction encoding method of this kind can especially enable the building of a code as described here above with reference to FIGS. 3a and 3b.

Naturally, other encoding and permutation steps can also be implemented to build the above-described codes and especially those codes illustrated in FIGS. 4a, 5a, 6a, 7a and 8a.

In order to obtain variation in the rate of the code obtained, it is also possible to zero-force the symbols (i.e. assign them a constant value of 0), at input on the information symbols and at output on the redundancy symbols.

10. Appendix 1

| Indices (m, a) | Built code $C_2^m{}_{+a}(n, k, d_{min} \leq d_{min}*)$ | Basic codes for building | Parameter $\Delta_m$ | Number of stages 2m + 3 |
|---|---|---|---|---|
| (0, 0) | $C_1(24, 12, d_{min} \leq 8)$ | $C_0*C_0*C_0$ | $\Delta_0 = 1$ | 3 |
| (1, 0) | $C_2(48, 24, d_{min} \leq 12)$ | $C_1*C_1$ | $\Delta_1 = 9$ | 5 |
| (1, 1) | $C_3(72, 36, d_{min} \leq 16)$ | $C_1*C_1*C_1$ | $\Delta_1 = 9$ | 5 |
| (2, 0) | $C_4(96, 48, d_{min} \leq 20)$ | $C_2*C_2$ | $\Delta_2 = 20$ | 7 |
| (2, 1) | $C_5(120, 60, d_{min} \leq 24)$ | $C_3*C_2$ | $\Delta_2 = 20$ | 7 |
| (2, 2) | $C_6(144, 72, d_{min} \leq 28)$ | $C_3*C_3$ | $\Delta_2 = 20$ | 7 |
| (2, 3) | $C_7(168, 84, d_{min} \leq 32)$ | $C_4*C_3$ | $\Delta_2 = 20$ | 7 |
| (3, 0) | $C_8(192, 96, d_{min} \leq 36)$ | $C_4*C_4$ | $\Delta_3 = 40$ | 9 |
| (3, 1) | $C_9(216, 108, d_{min} \leq 40)$ | $C_5*C_4$ | $\Delta_3 = 40$ | 9 |
| (3, 2) | $C_{10}(240, 120, d_{min} \leq 44)$ | $C_5*C_5$ | $\Delta_3 = 40$ | 9 |
| (3, 3) | $C_{11}(264, 132, d_{min} \leq 48)$ | $C_6*C_5$ | $\Delta_3 = 40$ | 9 |
| (3, 4) | $C_{12}(288, 144, d_{min} \leq 52)$ | $C_6*C_6$ | $\Delta_3 = 40$ | 9 |
| (3, 5) | $C_{13}(312, 156, d_{min} \leq 56)$ | $C_7*C_6$ | $\Delta_3 = 40$ | 9 |
| (3, 6) | $C_{14}(336, 168, d_{min} \leq 60)$ | $C_7*C_7$ | $\Delta_3 = 40$ | 9 |
| (3, 7) | $C_{15}(360, 180, d_{min} \leq 64)$ | $C_8*C_7$ | $\Delta_3 = 40$ | 9 |

-continued

| Indices (m, a) | Built code $C_{2^m+a}(n, k, d_{min} \leq d_{min^*})$ | Basic codes for building | Parameter $\Delta_m$ | Number of stages 2m + 3 |
|---|---|---|---|---|
| (4, 0) | $C_{16}(384, 102, d_{min} \leq 68)$ | $C_8*C_8$ | $\Delta_4 = 80$ | 11 |
| (4, 1) | $C_{17}(408, 204, d_{min} \leq 72)$ | $C_9*C_8$ | $\Delta_4 = 80$ | 11 |
| (4, 2) | $C_{18}(432, 216, d_{min} \leq 76)$ | $C_9*C_9$ | $\Delta_4 = 80$ | 11 |
| (4, 3) | $C_{19}(456, 228, d_{min} \leq 80)$ | $C_{10}*C_9$ | $\Delta_4 = 80$ | 11 |
| (4, 4) | $C_{20}(480, 240, d_{min} \leq 84)$ | $C_{10}*C_{10}$ | $\Delta_4 = 80$ | 11 |
| (4, 5) | $C_{21}(504, 252, d_{min} \leq 88)$ | $C_{11}*C_{10}$ | $\Delta_4 = 80$ | 11 |
| (4, 6) | $C_{22}(458, 228, d_{min} \leq 92)$ | $C_{11}*C_{11}$ | $\Delta_4 = 80$ | 11 |
| (4, 7) | $C_{23}(458, 228, d_{min} \leq 96)$ | $C_{12}*C_{11}$ | $\Delta_4 = 80$ | 11 |
| (4, 8) | $C_{24}(458, 228, d_{min} \leq 100)$ | $C_{12}*C_{12}$ | $\Delta_4 = 80$ | 11 |
| (4, 9) | $C_{25}(458, 228, d_{min} \leq 104)$ | $C_{13}*C_{12}$ | $\Delta_4 = 80$ | 11 |
| (4, 10) | $C_{26}(624, 312, d_{min} \leq 108)$ | $C_{13}*C_{13}$ | $\Delta_4 = 80$ | 11 |
| (4, 11) | $C_{27}(648, 324, d_{min} \leq 112)$ | $C_{14}*C_{13}$ | $\Delta_4 = 80$ | 11 |
| (4, 12) | $C_{28}(672, 336, d_{min} \leq 116)$ | $C_{14}*C_{14}$ | $\Delta_4 = 80$ | 11 |
| (4, 13) | $C_{29}(696, 348, d_{min} \leq 120)$ | $C_{15}*C_{14}$ | $\Delta_4 = 80$ | 11 |
| (4, 14) | $C_{30}(720, 360, d_{min} \leq 124)$ | $C_{15}*C_{15}$ | $\Delta_4 = 80$ | 11 |
| (4, 15) | $C_{31}(744, 372, d_{min} \leq 128)$ | $C_{16}*C_{15}$ | $\Delta_4 = 80$ | 11 |
| (5, 0) | $C_{32}(768, 384, d_{min} \leq 132)$ | $C_{16}*C_{16}$ | $\Delta_5 = 160$ | 13 |
| . | . | . | . | . |
| . | . | . | . | . |
| . | . | . | . | . |

Although the present disclosure has been described with reference to one or more examples, workers skilled in the art will recognize that changes may be made in form and detail without departing from the scope of the disclosure and/or the appended claims.

The invention claimed is:

1. An error correction encoding device, associating redundancy data with source data, said device comprising:
at least three encoding stages, each implementing at least one set of three basic encoding modules, including a first encoding stage, a last encoding stage and at least one intermediate encoding stage,
each basic encoding module implementing a basic code and comprising c inputs and c outputs, with c being an integer,
each encoding stage receiving data to be processed, distributed among the different basic encoding modules and delivering processed data coming from said basic encoding modules,
said first encoding stage receiving said source data and said last encoding stage delivering said redundancy data;
at least two permutation stages, said permutation stages being inserted between two successive encoding stages, called a previous encoding stage and a following encoding stage, and distributing the processed data coming from each basic encoding module of the previous encoding stage between at least two basic encoding modules of the following encoding stage, and wherein each permutation stage implements a c-cyclic type permutation.

2. The error correction encoding device according to claim 1, wherein said basic codes belong to the group consisting of:
a Hamming code with transfer matrix P;
a Hamming half-code with transfer matrix $P^+$ or $P^-$, resulting from a division into two of a Hamming code with transfer matrix P such that $P = P^+ \times P^- = P^- \times P^+$;
a left half-code such that:
for the even indices (2i) with $0 \leq 2i \leq (c-1)$:

$$r_{2i} = \sum_{j=-m}^{j=+m} x_{2i+j}, \text{ where } m = \left\lfloor \frac{\text{degree}}{2} \right\rfloor$$

the operator $\Sigma$ is the sum modulo 2 operator, also called an "exclusive OR" operator, and where the degree corresponds to the number of inputs of the "exclusive OR" operators;
for the odd indices (2i+1) with $1 \leq 2i+1 \leq (c-1)$:

$$r_{2i+1} = x_{2i+1},$$

with $r_i$ being redundancy data pieces and $x_i$ being source data pieces;
a right half-code that is dual to said left half-code such that:
for the even indices (2i) with $0 \leq 2i \leq (c-1)$:

$$r_{2i} = x_{2i},$$

for the odd indices (2i+1) with $1 \leq 2i+1 < (c-1)$:

$$r_{2i} = \sum_{j=-m}^{j=+m} x_{2i+j}, \text{ where } m = \left\lfloor \frac{\text{degree}}{2} \right\rfloor$$

the operator $\Sigma$ is the sum modulo 2 operator also called "exclusive OR" operator where the degree corresponds to the number of inputs of the "exclusive OR" operators;
with $r_i$ being redundancy data pieces and $x_i$ being source data pieces;
an identity code.

3. The error correction encoding device according to claim 1, wherein the device comprises:
at least one posterior scrambling stage inserted between two successive encoding stages, one posterior scrambling stage comprising two successive scrambling sub-stages called first and second posterior scrambling sub-stages implementing different types of scrambling, wherein said first posterior scrambling sub-stage comprises at least two distinct scrambling modules, each scrambling module receiving processed data coming from at least one set of three encoding modules of a same intermediate encoding stage and delivering scrambled data, taken at input of said second posterior scrambling sub-stage, and each scrambling module implementing different types of scrambling,
at least one prior scrambling stage, inserted between two successive encoding stages, the at least one prior scrambling stage comprising at least one prior scrambling sub-stage implementing a scrambling identical to a second posterior scrambling sub-stage of one of said posterior scrambling stages.

4. The error correction encoding device according to claim 3, wherein said prior scrambling stage includes at least two successive scrambling sub-stages, called first and second prior scrambling sub-stages, implementing different types of scrambling, and said second prior scrambling sub-stage includes at least two distinct scrambling modules, each scrambling module receiving scrambled data from said first prior scrambling sub-stage and providing re-scrambled data to at least one set of three encoding modules of a same intermediate encoding stage, and each scrambling module implementing different types of scrambling.

5. The error correction encoding device according to claim 3, wherein said scrambling modules or scrambling sub-stages implement a scrambling belonging to the group consisting of:

an identity scrambling such that:

$$\forall i=0, 1, \ldots, (k-1) \pi_k(i)=i;$$

a scrambling such that:

$$\forall i = 0, 1, \ldots, (k-1) \begin{cases} \pi_{\Delta,k}(i) = \Delta_0 + i(\bmod k) & \text{if } i \equiv 0(\bmod c) \\ \pi_{\Delta,k}(i) = \Delta_1 + i(\bmod k) & \text{if } i \equiv 1(\bmod c) \\ \vdots & \vdots \\ \pi_{\Delta,k}(i) = \Delta_{c-1} + i(\bmod k) & \text{if } i \equiv (c-1)(\bmod c); \end{cases}$$

with conditions where $\Delta=\{\Delta_0, \Delta_1, \ldots, \Delta_{c-1}\}$ is a set of integer parameters such that:

the parameters $(\Delta_0, \Delta_1, L, \Delta_{c-1})$ must take at least three different values, or if the parameters $(\Delta_0, \Delta_1, L, \Delta_{c-1})$ take only two different values then each of the two values is at least present twice in the set $\Delta$, a scrambling such that:

$$\pi_{Bk}(i) = \left\lfloor \frac{i}{p} \right\rfloor + c * (i \bmod p) \forall i = 0, 1, \ldots, (k-1), \text{ with } p = \left\lfloor \frac{k}{c} \right\rfloor,$$

with k being the permutation length.

6. The error correction encoding device according to claim 1, wherein all of said basic encoding modules implement an identical basic code.

7. The error correction encoding device according to claim 6, wherein said identical basic code is a Hamming code with a length n equal to eight, comprising k equal to four symbols of payload information and a minimum distance $d_{min}$ equal to four.

8. The error correction encoding device according to claim 1, wherein said permutation stages distribute two pieces of processed data coming from a basic encoding module of a preceding encoding stage among two basic encoding modules of a following encoding stage.

9. The error correction encoding device according to claim 1, wherein the device comprises a zero-forcing module placing at least one of said source data and/or at least one of said redundancy data at the value zero.

10. An error correction encoding method associating redundancy data with source data, wherein said method comprises:

at least three encoding steps, including a first encoding step, a last encoding step and at least one intermediate encoding step, each implementing at least one set of three basic encoding modules, each basic encoding module implementing a basic code and comprising c inputs and c outputs, with c being an integer, each encoding step receiving data to be processed, distributed among the different basic encoding modules and delivering processed data coming from said basic encoding modules, said first encoding step receiving said source data and said last encoding step delivering said redundancy data; and at least two permutation steps, said permutation steps being implemented between two successive encoding steps, called a preceding encoding step and a following encoding step, and distributing the processed data coming from each basic encoding module implemented in the previous encoding step between at least two basic encoding modules implemented in the following encoding step, and wherein each permutation step implements a c-cyclic type permutation.

11. A computer program stored on a non-transitory computer-readable medium, comprising instructions to implement an error correction encoding method that associates redundancy data with source data, when said program is executed by a processor, wherein the method comprises:

at least three encoding steps, including a first encoding step, a last encoding step and at least one intermediate encoding step, each implementing at least one set of three basic encoding modules, each basic encoding module implementing a basic code and comprising c inputs and c outputs, with c being an integer, each encoding step receiving data to be processed, distributed among the different basic encoding modules and delivering processed data coming from said basic encoding modules, said first encoding step receiving said source data and said last encoding step delivering said redundancy data; and at least two permutation steps, said permutation steps being implemented between two successive encoding steps, called a preceding encoding step and a following encoding step, and distributing the processed data coming from each basic encoding module implemented in the previous encoding step between at least two basic encoding modules implemented in the following encoding step, and wherein each permutation step implements a c-cyclic type permutation.

* * * * *